United States Patent [19]

Rowe et al.

[11] 3,869,703

[45] Mar. 4, 1975

[54] SEMICONDUCTOR DEVICE HAVING AN IMPROVED SUPPLY LEAD SUPPORT

[75] Inventors: Colin Michael Rowe; Francis Rayner, both of Stockport, England

[73] Assignee: U.S. Philips Corporation, New York, N.Y.

[22] Filed: Oct. 15, 1973

[21] Appl. No.: 406,266

Related U.S. Application Data

[63] Continuation of Ser. No. 308,032, Nov. 20, 1972, abandoned, which is a continuation of Ser. No. 123,544, March 12, 1971, abandoned.

[30] Foreign Application Priority Data

Mar. 16, 1970 Great Britain .................. 12507/70

[52] U.S. Cl. ...................... 357/79, 357/75, 357/76, 357/81

[51] Int. Cl. ........................... H01l 3/00, H01l 5/00

[58] Field of Search .......... 317/234, 1, 6, 11, 4, 4.1

[56] References Cited

UNITED STATES PATENTS

| | | | |
|---|---|---|---|
| 2,783,417 | 2/1957 | Eannarino | 317/234 |
| 2,826,725 | 3/1958 | Roberts | 317/234 |
| 3,437,887 | 4/1969 | Nowalk et al. | 317/234 |
| 3,559,004 | 1/1971 | Rambeau et al. | 317/234 |

FOREIGN PATENTS OR APPLICATIONS

| | | | |
|---|---|---|---|
| 1,143,874 | 2/1969 | Great Britain | 317/234 |

*Primary Examiner*—Andrew J. James
*Attorney, Agent, or Firm*—Frank R. Trifari; Leon Nigohosian

[57] ABSTRACT

A semiconductor device such as a thyristor in which a supply lead is supported above an electrode by an open-sided, mechanically stable, electrically conductive member mounted on the electrode.

14 Claims, 5 Drawing Figures

INVENTORS
COLIN MICHAEL ROWE
FRANCIS RAYNER
BY
AGENT

INVENTORS
COLIN MICHAEL ROWE
FRANCIS RAYNER
BY
[signature]
AGENT

SEMICONDUCTOR DEVICE HAVING AN IMPROVED SUPPLY LEAD SUPPORT

This is a continuation of Ser. No. 308,032, filed Nov. 20, 1972, now abandoned which in turn is a continuation of Ser. No. 123,544, filed Mar. 12, 1971 and now abandoned.

This invention relates to semiconductor devices, particularly but not exclusively to semiconductor controlled rectifiers, and further relates to electrically conductive interconnection members for forming an electrical connection in such semiconductor devices.

It is known to form an electrical connection between a supply conductor and an electrode on a semiconductor body of a semiconductor device by securing the supply conductor directly to the electrode. However, such simple connections can result in difficulties in certain cases.

FIG. 1 is a perspective view of part of a known semiconductor device consisting of a thyristor and incorporating such known electrical connections. The thyristor of FIG. 1 comprises a monocrystalline silicon body 1 having therein a diffused n-type cathode region, a diffused p-type base region, an n-type base region and a diffused p-type anode region. The n-type cathode region has an annular form surrounding part of the p-type base region, is adjacent one surface of the body 1 and is contacted at the one surface by an annular cathode electrode 2. The annular cathode electrode 2 comprises an annular molybdenum plate secured to a thinner metallised annular portion which was deposited on the silicon surface. The portion of the p-type base region within the annular cathode region and extending to the one surface of the body 1 is contacted at the one surface by a centre metal gate electrode 3. The body 1 is mounted on and secured by its opposite surface to a molybdenum disc 7 on a copper heat sink 4 associated with the anode terminal of the device. A thin conductor lead 5 associated with the gate terminal of the device is secured to the centre metal gate electrode 3, and a supply conductor 6 associated with the cathode terminal of the device is secured to the annular molybdenum plate of the cathode electrode 2.

During the manufacture of the device of FIG. 1, a hard-solder technique, for example using a gold-based eutectic solder, may be employed to secure the molybdenum disc 7 to the silicon body 1 and to the copper heat sink 4, to secure the annular molybdenum plate to the thinner metallised portion of the cathode electrode 2, and to secure the lead 5 and the supply conductor 6 to their respective electrodes 3 and 2. To reduce the strain produced in the silicon crystal and so reduce the risk of the body 1 cracking during and subsequent to such a hard-soldering operation, it is found desirable to maintain as small as possible the thickness and outer diameter of the annular molybdenum plate of the cathode electrode 2; the inner diameter of this annules is determined by the required dynamic electrical characteristics of the thyristor. However, this annular molybdenum plate should be as large as possible to permit the supply conductor 6 associated with the cathode terminal of the device and having a size determined by its current handling requirements to be secured simply yet reliably thereto. The securing of a large supply conductor 6 to such an annular molybdenum plate of the cathode electrode 2 may result in excess strain in the silicon crystal during and subsequent to assembly, and/or possible damage of the cathode junction by the solder used; the width of the annular molybdenum plate may be insufficient for mounting thereon a supply conductor 6 having a particularly large cross-section.

It is desirable to form in a comparatively simple, non-expensive manner an electrical connection between a comparatively large supply conductor and an electrode while avoiding or substantially reducing such disadvantages.

According to a first aspect of the invention, a semiconductor device comprises a semiconductor body, an electrode at one surface of the body, an electrically conductive interconnection member mounted on the electrode, and a supply conductor supported above the electrode by the interconnection member, the interconnection member consisting of a metal strip mechanically deformed to extend alternately between two levels to form therebetween an open-sided structure having at each of the two levels discrete contact portions mutually spaced around an area at that level, the contact portions at one level being distributed on the electrode and secured thereto to form a mechanically stable structure, and the connection between the interconnection member and the supply conductor being established via the contact portions at the other level.

The interconnection member mounted on the electrode supports the supply conductor above the electrode so that problems concerning the securing of the supply conductor are transferred from the electrode to the interconnection member contact portions at the other level. Such an interconnection member in the form of a metal strip mechanically deformed to extend alternately between two levels to form therebetween an open-sided structure having at each of the two levels discrete contact portions mutually spaced around an area at that level, can be a particularly advantageous structure during certain stages in the manufacture of semiconductor devices; the deformed metal strip structure can be manufactured in a comparatively simple and inexpensive manner; such an interconnection member can form a particularly stable, sturdy structure which has mechanical flexibility in the portion of the strip which extend between between the contact portions at the two levels and has the form of the contact portions at the one level chosen so as to be compatible with the structure of the electrode on which they are distributed and with the permissible strain in the semiconductor body. As discussed hereinafter, the open-sidedness of the structure can be important for the manufacture of certain semiconductor devices. The mechanical stability of the structure facilitates manufacture of the device and can be achieved by appropriate design of the structure even in certain cases where the electrode has a comparatively small area or/and intricate configuration.

The metal strip may consist of a suitable strip of wire which extends around a space between the two levels and alternates between the two levels to form the discrete mutually spaced contact portions at the base of U-shaped or V-shaped portions of the wire. Such a wire need not form a closed figure but may have ends which are not secured together, and in certain cases, one or even both of these ends may form one said discrete contact portion. However, usually, in order to facilitate the semiconductor device manufacture, it is preferable for the strip to form a closed figure. Thus, the open-side interconnection member may be an annular metal strip structure consisting of a metal annulus mechanically deformed between the two levels. However, it will be evident that such an annulus need not have a circular outline.

The interconnection member may be a metal strip structure which is corrugated between two levels to form the discrete mutually spaced contact portions of each level at the base of a corrugation. Such an interconnection member formed by mechanical deformation of a flat metal strip can have considerable mechanical stability.

When the interconnection member consists of an annular metal strip, the strip may form alternate step portions at two levels, the step portions at each level forming the contact portions at that level. In this case, the step portions may be substantially identical; the interconnection member may be formed by deformation of a flat metal annulus so that the contact portions are provided at opposite major surfaces of the metal strip. Such an interconnection structure can be advantageous for comparatively simple manufacture of semiconductor devices such as semiconductor controlled rectifiers; because of its symmetry, it can be placed either side up on the electrode; the arrangement of its contact portions is well adapted to part-circular or part-annular electrodes; in a sub-assembly including such an interconnection member mounted on and secured to the electrode on the semiconductor body, it can act as a convenient structure for gripping with tweezers while handling the sub-assembly, and provides few pockets in which a previously used etchant can collect and remain after rinsing the sub-assembly with water to quench the etchant. The openness and radial symmetry of such a structure permits rather than restricts free passage therethrough so permitting efficient rinsing of the sub-assembly. In the manufacture of a semiconductor controlled rectifier, certain acid etchants which may be used to remove surface damage from the semiconductor body after profiling its edges have very critical etching times of the order of seconds. Thus, in such a case, the elimination of such pockets and the provision of such an open structure is important; it can simplify the rinsing of such a sub-assembly so that several can be rinsed simultaneously in a jig tray by directing water onto the tray from above.

Only three mutually spaced discrete contact portions need be present at each of the sides of the interconnection member; in this manner a particularly mechanically stable structure can result, based on the tripod principle. However, it will be evident that in certain cases other suitable arrangements having four or more contact portions at a level of the interconnection member may be employed if so desired.

The contact portions at the other level may be distributed on and secured to a substantially flat end surface of the supply conductor. However, it may be desirable or even necessary to use a supply conductor and an interconnection member of which the mutually adjacent portions are incompatible for such direct connection between the supply conductor and the interconnection member.

Thus, in another form, which will be preferred in many cases and essential in certain cases, the contact portions at the other level are distributed on and secured to a lower major surface of a platform member supported above the electrode by the interconnection member, the supply conductor being mounted on and secured to an upper major surface of the platform member. The provision of a platform member in addition to the interconnection member permits greater freedom in choosing the size, shape, arrangement and material of the platform member and of the interconnection member so as to be compatible with those of the supply conductor and those of the electrode respectively. The platform member can be chosen such that its surface area is larger or/and of more regular shape than the electrode, so permitting, for example, a supply conductor having a comparatively large cross-section to be mounted thereon and secured thereto.

A substantially flat metal plate may form the platform member and such a plate may have the form, for example, of a disc or annulus. However, it will be evident that other forms of platform member may be employed. The platform member may have mechanical flexibility and consist of a bent metal sheet having one part on which the supply conductor is mounted and which extends over and is situated above the part secured to the interconnection member. The upper surface on which the supply conductor is mounted may have a collar portion within which the end of the supply conductor is accommodated and secured for example by crimping. The platform member may be a single member or may consist of several components secured together.

The platform member may have a larger available area for mounting thereon the supply conductor than has the electrode. Thus, the electrode may have no available area which is large enough to accommodate the cross-section of the supply conductor. However, this invention is also applicable for devices in which the available area on the electrode is sufficient to accommodate the cross-section of the supply conductor, regardless of the relative available areas of the platform member and electrode; in such a case, the indirect securing of a supply conductor via platform and interconnection members to the electrode may be advantageous in reducing strain produced in the structure, in particular in the semiconductor body, as compared with known methods of directly securing the supply conductor to the electrode.

The platform member may be secured to the interconnection member separate from and subsequent to securing the interconnection member to the electrode. It will be evident that in certain cases the supply conductor may be secured to the platform member before, during or even after securing the platform member to the interconnection member.

The electrode to which the interconnection member is secured may be a deposited metal layer on the semiconductor body surface. In another form, the portion of the electrode to which the interconnection member is secured is a metal plate portion of the electrode. Thus, the electrode may comprise a flat metal plate which is secured to a thinner metallised portion on the one surface of the semiconductor body, the contact portions at the one level of the interconnection member being mounted on and secured to the metal plate; such a plate which can form the major portion of the electrode is chosen to have such a size and form that it can be secured in a reliable manner to the thinner portion, for example by hard-soldering, while permitting the adjacent contact portions of the interconnection member to be secured reliably thereto. By appropriately designing the interconnection member, the restrictions imposed on the metal plate portion of the electrode need not be as severe as those that would be imposed if the supply conductor which is supported by the interconnection member were secured instead directly to the metal plate portion of the electrode.

In this case, by appropriate design (particularly of the metal plate portion of the electrode and the adjacent contact portions of the interconnection member) the thinner metallised portion and metal plate of the electrode, the interconnection member, the platform member (if present) and the supply conductor may be secured by hard-solder, without producing excess strain in the semiconductor body.

The electrode may have a variety of configurations depending on the type of semiconductor device, for example a large area circular configuration or an annular configuration, and may have recessed portions, for example around its periphery.

The electrode may be a first, substantially annular electrode surrounding a second electrode at the one surface of the semiconductor body, and an insulated conductor lead which is secured at one end to the second electrode extend through the interconnection member and, when a platform member is provided, this lead may further extend through an aperture or recess in the platform member. In these cases, the device may be a semiconductor controlled rectifier, the opposite surface of the semiconductor body be mounted on and secured to a heat sink, the heat sink and the said supply conductor be associated with anode and cathode terminals of the device, and the insulated conductor lead be associated with a control gate terminal of the device.

It will be evident that types of semiconductor device other than semiconductor controlled rectifiers are also possible in accordance with the invention, for example high power semiconductor diodes.

An embodiment of the invention will now be described, by way of example, with reference to the diagrammatic drawings in which.

Figure 1:
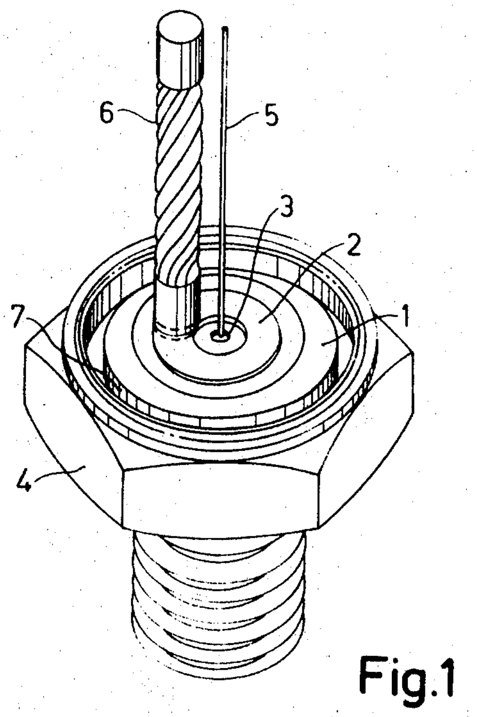
Figure 2:
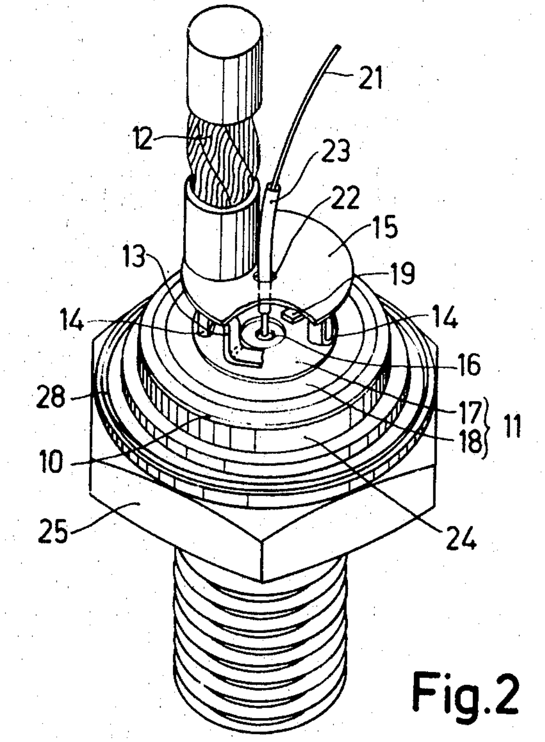
FIG. 2 is a perspective view of part of a semiconductor device in accordance with the invention.

In FIG. 2 part of the interconnection member and platform member are shown out-away, and a silicone rubber coating on exposed surface portions of the thyristor element is omitted to simplify the drawing.

Figure 3:
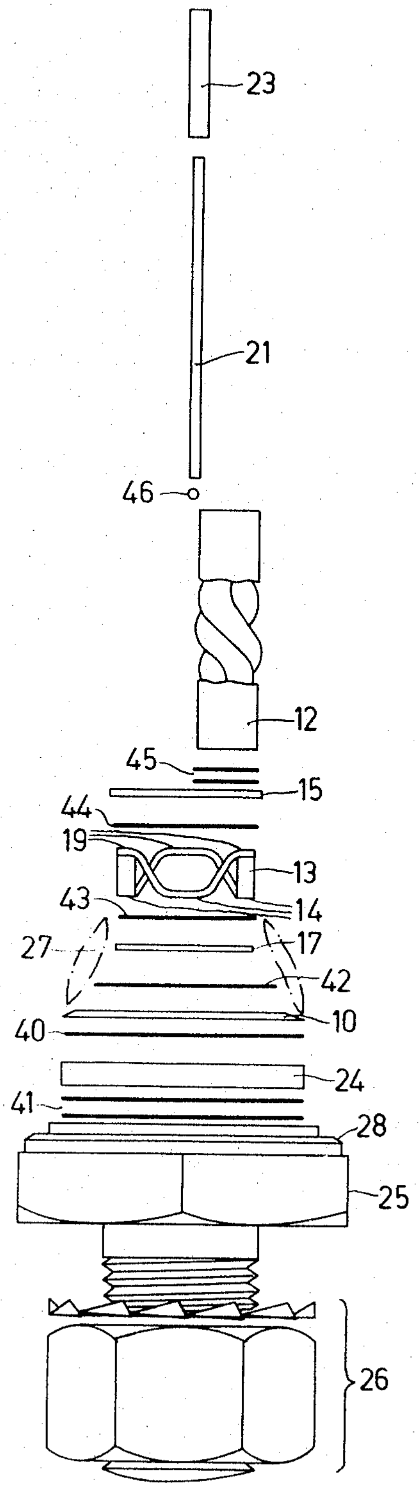
FIG. 3 is an exploded side view of parts of the device of FIG. 2.
Figure 4:
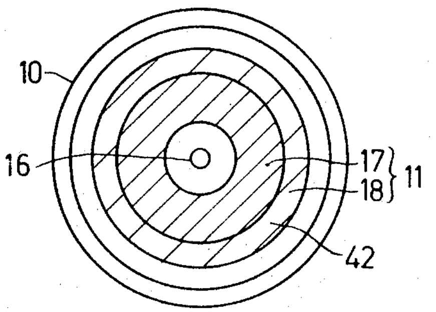
FIG. 4 is a plan view of one major surface of the semiconductor element of the device of FIG. 2.

The semiconductor device illustrated in FIGS. 2 to 4 is a high current thyristor comprising a thyristor element of which cathode electrode 11 is electrically connected to a current supply conductor 12 via an interconnection member 13 which is mounted on and secured to the cathode electrode 11 and a platform member 15 which is mounted on the interconnection member 13 and situated directly above the thyristor element, the supply conductor 12 being mounted on and secured to the platform member 15.

The thyristor element comprises a monocrystalline silicon body 10 at one major surface of which the cathode electrode 11 forms a first, annular electrode surrounding a second, centre gate electrode 16 of the semiconductor element (FIG. 4). The body 10 has beteween its opposite major surfaces a diffused n-type cathode region, a diffused p-type base region, an n-type base region and a diffused p-type anode region. The n-type cathode region has an annular form surrounding a central portion of the p-type base region, and both the n-type cathode region and portions of the p-type base region adjoin the one major surface of the body 10. The central portion of the p-type base region is contacted at the one major surface by the gate electrode 16. The n-type cathode region is contacted at the one major surface by the cathode electrode 11 which also short-circuits smaller, evenly spaced portions of the p-type base region which are surrounded by the n-type cathode region and extend to the surface below the cathode electrode 11. The p-type anode region adjoins the opposite major surface of the body 10 contacted by an anode electrode of the element.

Figure 5:
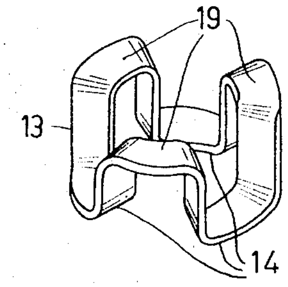
FIG. 5 is a perspective view of an interconnection member of the device of FIG. 2.

The cathode electrode 11 comprises an annular gold-plated molybdenum plate 17 secured to a thinner gold-plated nickel metallised annular portion 18 on the silicon surface. The interconnection member 13 consists of an annular strip 18 of gold-plated silver forming alternate step portions at two levels as shown in FIG. 5. The step portions at one level form three mutually spaced discrete contact portions 14 at one major surface of the strip and these contact portions 14 are distributed over the area of the annular gold-plated molybdenum plate 17 of the cathode electrode 11 and secured thereto by a gold-based solder. The step portions at the other level form three mutually spaced, discrete contact portions 19 at the opposite major surface of the strip, and these contact portions 19 are distributed over and secured by a gold-based solder to a lower major surface of annular copper plate which forms the platform member 15. The supply conductor 12 is of copper and is secured by gold-tin solder to an upper major surface of the copper plate which forms the platform member 15, Thus, the interconnection member 13 associated with the annular gold-plated molybdenum plate 17 of the cathode electrode 11 is of gold-plated silver, whereas the platform member 15 associated with the copper supply conductor 12 is of copper.

A gold-plated silver wire conductor lead 21 is secured at one end to the centre gate electrode 16 on the central portion of the p-type base region at the one major surface body 10. The conductor lead 21 extends through the annular interconnection member 13 and through an aperture 22 in the copper plate forming the platform member 15 and is insulated therefrom by a sleeve 23 of insulating silicone rubber. The conductor lead 21 is associated with the gate terminal of the device, while the supply conductor 12 is associated with the cathode terminal of the device. The diameter of the supply conductor 12 is 5.4 mm.; while the width of the annular plate 17 of cathode electrode 11 is 3.5 mm, its inner diameter is 4.5 mm., its outer diameter is 11.5 mm., and its thickness is approximately 0.2 mm. It would be impracticable to attempt to secure the conductor 12 directly to the plate 17. However, the provision of the interconnection member 13 enables the plate 17 of the cathode electrode 11 to be electrically connected to the supply conductor 12 in a reliable manner.

The annular copper plate forming the platform member 15 on the interconnection member 13 has a greater thickness than the annular molybdenum plate 17 of the cathode electrode 11 and a larger available surface area for connection of the supply conductor 12; its thickness is 0.8 mm., its inner diameter is 1.7 mm., and its outer diameter is 12.7 mm. The aperture 22 of the annular platform member 15 and the insulating sleeve 23 provide insulation for the gate conductor lead 21. The interconnection member 13 supports the platform member 15 and spaces it above the cathode electrode 11 by approximately 3.5 mm., the height of the interconnection member. The annular strip forming the interconnection member 13 has an inner diameter of 6.3 mm. and an outer diameter of 10 mm. The step portions forming contact portions 14 and 19 of the interconnection member 13 permit the formation of a stable assembly when the larger annular copper plate is mounted on this annular strip mounted on the annular molybdenum plate 17 of the cathode electrode 11.

A protective insulating silicone rubber coating 27, shown in the exploded view of FIG. 3, is present on otherwise-exposed surface portions of the thyristor element.

The opposite major surface of the wafer 10 associated with the p-type anode is situated on a molybdenum disc 24 which is itself situated on a copper header portion 25 of the device envelope forming a heat sink for the thyristor element and an anode terminal of the device. The envelope of the device is completed by a conventional top cap (not shown in the drawings) which is mounted on the header portion 25 around a weld rim 28 thereof. The top cap includes connecting portions for connecting the upper ends of the cathode supply conductor 12 and the gate lead 21 to cathode and gate terminal leads respectively of the device. The whole device envelope is of a conventional standard outline. A lock washer and nut 26 is provided on a threaded portion of the copper header portion 25 which forms the anode terminal of the device, for securing the header portion 25 in a suitable aperture in a board or chassis associated with the electrical circuit in which the device is employed.

The device of FIGS. 2 to 5 is manufactured in the following manner:

The thyristor element is formed using conventional processing by diffusing acceptor impurities into opposite major surfaces of an n-type silicon body to form the p-type base region and the p-type anode region, and subsequently diffusing donor impurity selectively into the p-type based region to form the n-type cathode region. The gate electrode 16 and the thin metallised annular portion 18 of the cathode electrode 11 are provided using conventional techniques of nickel deposition and gold plating.

The thyristor element is mounted on a gold-germanium alloy solder disc 40 on the molybdenum disc 24. Using a heat treatment, the opposite major surface of the silicon body 10 is soldered to the molybdenum disc 24 which acts as a support for the body 10 during a subsequent bevelling stage. In the bevelling stage, the edge of the body 10 is mechanically bevelled to provide a bevel angle of 4½° at the edge portion at which the junction between the p-type and n-type base regions terminates and a bevel angle of 20° at the edge portion at which the junction between the n-type base region and p-type anode region terminates.

The assembly of the bevelled thyristor element and the molybdenum disc 24 is positioned in a jig. The annular gold-plated molybdenum plate 17 of the cathode electrode 11 is placed on a gold-germanium alloy solder ring 42 on the thinner metallised annular portion 18 of the cathode electrode 11, see FIGS. 3 and 4. The gold-plated silver annular strip forming the interconnection member 14 and having step portions at two levels is mounted on a gold-tin alloy solder ring 43 on the annular gold-plated molybdenum plate 17 of the cathode electrode 11. In addition, the gold-plated silver gate lead 21 is mounted in the jig on a gold-germanium solder sphere 46 on the metallised gate electrode 17. Using a heat treatment the interconnection member 13 is secured to the annular plate 17 which is itself secured to the metallised portion 18 of the cathode electrode 11, and the gate lead 21 is secured to the gate electrode 16.

The resulting assembly is now subjected to a conventional etching technique, to remove, in particular, surface damage caused to the silicon body 11 during bevelling. The assembly is rinsed with water to quench etching and is dried. The advantageous shape of the interconnection member 13 as shown in FIG. 5 permits efficient rinsing therethrough, provides few pockets in which the etchant can remain to cause damage to the thyristor element, and also provides a more convenient and sturdy structure than the gate lead for gripping the assembly with tweezers during handling.

The silicone rubber coating 27 and the silicone rubber sleeve 23 are now provided on the exposed surface portions of the thyristor element and on the gate lead 21 respectively.

In another jig, the structure of FIG. 2 is subsequebtly assembled. On the copper header portion 25, gold-tin solder discs 41 are placed and the assembly of the interconnection member 13, gate-lead 21, thyristor element and molybdenum disc 24 is mounted on the solder discs 41. The copper platform member 15, the lower surface of which is pretinned with a gold-tin solder annulus 44, is mounted on the interconnection member 13, and the copper cathode supply conductor 12 is mounted on gold-tin solder discs 45 on the upper surface of the platform member 15. The concentricity and radial symmetry associated with the annular platform member 15 and the interconnection member 13, facilitates the process of assembly. During a heat treatment, the components are secured together to form the structure of FIG. 2.

The encapsulation is completed in a conventional manner by securing the top cap onto the copper header portion 25, securing the cathode supply conductor 12 to the external cathode terminal lead, and securing the gate lead 21 to the external gate terminal lead.

Such a thyristor in accordance with the invention has been manufactured having a r.m.s. current rating of 110 Amps and voltage ratings of at least 1,200 Volts. Minimum *dV/dt* and *dI/dt* ratings were 200 Volts/microsecond and 200 Amps/microsecond respectively.

It will be evident that many modifications are possible within the scope of this invention. The interconnection member 13 may be of other material, for example copper and need not form a closed or annular structure. Such an interconnection member still forms a structure which is corrugated or alternates between the two levels and forms mutually spaced discrete contact portions 14 and 19 at the base of a corrugation at each level.

Since the interconnection member 13 is open-sided, the insulated gate lead 21 may extend through a gap in the side of the interconnection member 13 between two of the upright portions of the strip between the contact portions 14 and 19 at the two levels.

When the supply conductor 12 is of particularly large cross-section throughout its length, or has an end of particularly large cross-section the platform member 15 may be entirely omitted in certain cases, and the end of the supply conductor 12 be mounted directly on and secured directly to the mutually spaced adjacent contact portions 19 of the interconnection member 13.

What is claimed is:

1. A semiconductor device comprising:

a. a semiconductor body comprising first and second major surfaces oppositely disposed to each other;

b. a first electrode disposed at said first major surface and a second electrode disposed at said second major surface of said body, said semiconductor body containing a main current path between said first and second electrodes;

c. an interconnection member fixedly secured to said first electrode, said interconnection member comprising a metal strip extending alternately between two levels to form therebetween an open-sided structure having at each of the two levels plural discrete contact portions mutually spaced around the area at each respective level, said interconnection member being fixedly secured at said contact portions at one of said levels to said first electrode to form a mechanically stable structure and an electrical contact;

d. main current-carrying supply conductor fixedly secured at said interconnection member contact portions at the other of said levels to provide a main current connection to said first electrode, said supply conductor being supported above said first electrode by said interconnection member;

e. an electrically and thermally conductive header member to which said semiconductor body is fixedly secured at said second electrode to provide a heat sink for said semiconductor body and to provide a main current connection to said second electrode; and f. a thin metallized element disposed at said first surface of said semiconductor body, said first electrode comprising a flat metal plate that has first and second oppositely disposed major surfaces and that is fixedly secured at said first surface of said first electrode to said metallized element, said contact portions at said one level of said interconnection member being mounted on and fixedly secured to said second surface of said first electrode.

2. A semiconductor device as defined in claim 1, wherein said interconnection member is a metal annulus whose plane is mechanically deformed between said two levels to form said contact portions.

3. A semiconductor device as recited in claim 2, wherein said interconnection member comprises alternate step portions at said two levels, said step portions at each said level comprising said contact portions at said each level.

4. A semiconductor device as recited in claim 3, wherein said step portions at said two levels are substantially identical.

5. A semiconductor device as recited in claim 2, wherein said interconnection member is produced from a flat metal structure so that said contact portions are provided at opposite major surfaces of said metal structure.

6. A semiconductor device as recited in claim 1, wherein only three mutually spaced discrete contact portions are present at each of said two levels of said interconnection member.

7. A semiconductor device as recited in claim 1, wherein said supply conductor comprises a substantially flat end surface and said contact portions at said other level are distributed on and fixedly secured to said end surface.

8. A semiconductor device as recited in claim 1, further comprising a platform member disposed between said interconnection member and said supply conductor and having upper and lower major surfaces, said contact portions at said other level being distributed on and fixedly secured to said lower major surface so that said platform member is supported above said first electrode by said interconnection member, and said supply conductor being mounted on and fixedly secured to said upper major surface of said platform member.

9. A semiconductor device as recited in claim 8, wherein said platform member comprises a substantially flat metal plate.

10. A semiconductor device as recited in claim 9, wherein said upper major surface area of said platform member available for mounting said supply conductor thereon exceeds the available such areas of said first electrode.

11. A semiconductor device as recited in claim 1, wherein said metallized element and said first electrode, and said interconnection member and said supply conductor are fixedly secured by a hard solder.

12. A semiconductor device as recited in claim 1, wherein said first electrode is substantially annular and said device further comprises a third electrode disposed at said first major surface of said semiconductor body and an insulated conductor lead which is secured at one end thereof to said third electrode and extends through said interconnection member, said annular first electrode surrounding said third electrode and said conductor lead being of smaller cross-sectional area than said supply conductor.

13. A semiconductor device as recited in claim 12, further comprising a platform member disposed between said interconnection member and said supply conductor, said platform member having an upper and lower major surfaces and including an aperture, said contact portions at said other level being distributed on and fixedly secured to said lower major surface so that said platform member is supported above said first electrode by said interconnection member, said supply conductor being mounted on and fixedly secured to said upper major surfaces of said platform member and said insulated conductor lead further extending through said platform member aperture.

14. A semiconductor device as recited in claim 12, wherein said semiconductor device is a semiconductor controlled rectifier, said header member, said supply conductor and said insulated conductor lead respectively providing anode, cathode, and control gate terminal connections of said device.

* * * * *